US 10,204,988 B2

(12) United States Patent
Astley

(10) Patent No.: US 10,204,988 B2
(45) Date of Patent: Feb. 12, 2019

(54) GRAPHENE DOUBLE-BARRIER RESONANT TUNNELING DEVICE

(71) Applicant: Nokia Technologies Oy, Espoo (FI)

(72) Inventor: Michael Astley, Waterbeach (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/536,706

(22) PCT Filed: Dec. 1, 2015

(86) PCT No.: PCT/FI2015/050838
§ 371 (c)(1),
(2) Date: Jun. 16, 2017

(87) PCT Pub. No.: WO2016/102751
PCT Pub. Date: Jun. 30, 2016

(65) Prior Publication Data
US 2017/0345898 A1 Nov. 30, 2017

(30) Foreign Application Priority Data
Dec. 24, 2014 (EP) .................................... 14200335

(51) Int. Cl.
*H01L 29/82* (2006.01)
*H01L 29/08* (2006.01)
(Continued)

(52) U.S. Cl.
CPC .......... *H01L 29/0895* (2013.01); *B82Y 10/00* (2013.01); *C01B 21/064* (2013.01);
(Continued)

(58) Field of Classification Search
CPC .......................... H01L 29/0895; C01B 32/182
See application file for complete search history.

(56) References Cited

U.S. PATENT DOCUMENTS

2006/0012000 A1  1/2006 Estes et al.
2010/0108981 A1  5/2010 Jayasekara et al.
(Continued)

FOREIGN PATENT DOCUMENTS

WO  WO 2013/140181 A1  9/2013

OTHER PUBLICATIONS

Nguyen et al.,"Resonant tunneling diodes based on graphene/h-BN heterostructure"; Jul. 30, 2012; Online at "stacks.iop.org/jPuhsD/45/325104), entire document.*
(Continued)

*Primary Examiner* — Julio J Maldonado
*Assistant Examiner* — Andre' C Stevenson
(74) *Attorney, Agent, or Firm* — Alston & Bird LLP

(57) ABSTRACT

An apparatus comprising: a fermion source nanolayer (90); a first insulating nanolayer (92); a fermion transport nanolayer (94); a second insulating nanolayer (96); a fermion sink nanolayer (98); a first contact for applying a first voltage to the fermion source nanolayer; a second contact for applying a second voltage to the fermion sink nanolayer; and a transport contact for enabling an electric current via the fermion transport nanolayer. In a particular example, the apparatus comprises three graphene sheets (90, 94, 98) interleaved with two-dimensional Boron-Nitride (hBN) layers (92, 96).

22 Claims, 2 Drawing Sheets

(51) Int. Cl.
  *B82Y 10/00* (2011.01)
  *H01L 29/73* (2006.01)
  *H01L 29/88* (2006.01)
  *H01L 29/16* (2006.01)
  *C01B 32/182* (2017.01)
  *C01B 21/064* (2006.01)
  *H01L 29/20* (2006.01)
  *H01L 29/76* (2006.01)

(52) U.S. Cl.
  CPC ........ *C01B 32/182* (2017.08); *H01L 29/1606* (2013.01); *H01L 29/2003* (2013.01); *H01L 29/7311* (2013.01); *H01L 29/882* (2013.01); *C01P 2006/40* (2013.01); *H01L 29/7613* (2013.01); *Y10S 977/734* (2013.01); *Y10S 977/831* (2013.01); *Y10S 977/937* (2013.01)

(56) References Cited

U.S. PATENT DOCUMENTS

| | | | |
|---|---|---|---|
| 2012/0068157 A1* | 3/2012 | Kub | B82Y 10/00 257/15 |
| 2013/0270188 A1 | 10/2013 | Karnik et al. | |
| 2014/0008616 A1 | 1/2014 | Geim et al. | |
| 2014/0166984 A1 | 6/2014 | Gunlycke et al. | |

OTHER PUBLICATIONS

International Search Report and Written Opinion received for corresponding Patent Cooperation Treaty Application No. PCT/FI2015/050838, dated Feb. 25, 2016, 18 pages.

Hung Nguyen V. et al. "Paper; Resonant tunnelling diodes based on graphene/h-BN heterostructure; Resonant tunnelling diodes based on graphene/h-BN heterstructure", Journal of Physics D. : Applied Physics, Institute of Physics Publishing Ltd, GB, vol. 45, No. 32, Jul. 30, 2012, pp. 325104.

L. Britnell et al. "Resonant tunnelling and negative differential conductance in graphene transistors", Nature Communications, vol. 4, Apr. 30, 2013, p. 1794.

Yanqing Wu et al. "Three-Terminal Graphene Negative Differential Resistance Devices", ACS NANO, vol. 6 No. 3 Mar. 27, 2012. pp. 2610-2616.

Debdeep Jena: "Tunneling Transistors Based on Graphene and 2-D Crystals", Proceedings of the IEEE, IEEE New York, US, vol. 101 No. 7, Jul. 1, 2013 pp. 1585-1602.

Avsar et al., "2d Van Der Waals Heterostructures" Ozyilmaz Group [online][retrieved May 3, 2018] Retrieved from the Internet:<URL: http://graphene.nus.sg/barbarous, (dated Aug. 2004), 4 pages.

Daowei He et al., "Two-dimensional Quasi-freestanding Molecular Crystals for High-performance Organic Field-effect Transistors", Nature Communications, (2014) 7 pages.

Maezawa, K "A new generation of negative-resistance devices—New developments in ultrahigh-frequency applications based on resonant tunneling elements." Electronics and Communications in Japan (Part II: Electronics) 89.4 (2006): 29-38.

Mishchenkol et al., Twisted-controlled Resonant Tunneling in Graphane/boron Nitride/graphene, (Research Paper), Published (Sep. 7, 2014), 20 pages.

* cited by examiner

GRAPHENE DOUBLE-BARRIER RESONANT TUNNELING DEVICE

RELATED APPLICATION

This application was originally filed as PCT Application No. PCT/FI2015/050838 filed Dec. 1, 2015 which claims priority benefit from EP Application No. 14200335.9 filed Dec. 24, 2014.

TECHNOLOGICAL FIELD

Embodiments of the present invention relate to an apparatus that is able to provide negative absolute resistance in an electrical circuit.

BACKGROUND

It would be desirable to provide an apparatus that is able to operate as an active resistor providing negative absolute resistance in an electrical circuit.

Such an apparatus may, for example, be used in amplifier, oscillator, chaotic and other circuits.

BRIEF SUMMARY

According to various, but not necessarily all, embodiments of the invention there is provided an apparatus comprising: a fermion source nanolayer; a first insulating nanolayer; a fermion transport nanolayer; a second insulating nanolayer; a fermion sink nanolayer; a first contact for applying a first voltage to the fermion source nanolayer; a second contact for applying a second voltage to the fermion sink nanolayer; and a transport contact for enabling an electric current via the fermion transport nanolayer.

The apparatus may, in some but not necessarily all examples, comprise circuitry configured to control the first voltage at the first contact and second circuitry configured to control the second voltage at the second contact.

In some but not necessarily all examples, the fermion source nanolayer may form a resonant quantum tunneling fermion source and the fermion sink nanolayer may form a resonant quantum tunneling fermion sink.

In some but not necessarily all examples, the fermion source nanolayer and the first insulating nanolayer form a first two dimensional quantum well, the fermion sink nanolayer and the second insulating nanolayer form a second two dimensional quantum well and the fermion transport nanolayer forms an intermediate quantum well between the first insulating layer and the second insulating layer In some but not necessarily all examples, the fermion source nanolayer, the fermion transport nanolayer and the fermion sink nanolayer are two dimensional semiconductor structures.

In some but not necessarily all examples, the fermion source nanolayer the fermion transport nanolayer and the fermion sink nanolayer are two dimensional Van-der-Waals materials.

In some but not necessarily all examples, the first insulating nanolayer and the second insulating nanolayer are two dimensional Van-der-Waals materials.

In some but not necessarily all examples, the fermion source nanolayer; the first insulating nanolayer; the fermion transport nanolayer; the second insulating nanolayer; the fermion sink nanolayer each have a thickness of less than 10 nm.

In some but not necessarily all examples, the fermion source nanolayer, the fermion transport nanolayer and the fermion sink nanolayer are graphene layers or monolayers.

In some but not necessarily all examples, the a first insulating nanolayer; and the second insulating nanolayer comprise hexagonal boron nitride.

In some but not necessarily all examples, the current path between the fermion source nanolayer and the fermion transport nanolayer has a negative differential resistance and the current path between the fermion sink nanolayer and the fermion transport nanolayer has a negative differential resistance, when the fermion source nanolayer and the fermion sink nanolayer are operated with opposite voltage bias, with respect to the fermion transport nanolayer, at the first and second contacts.

The apparatus may, in some but not necessarily all examples, comprise means for doping the fermion source nanolayer relative to the fermion transport nanolayer and for doping the fermion sink nanolayer relative to the fermion transport nanolayer.

According to various, but not necessarily all, embodiments of the invention there is provided an apparatus comprising: a method comprising: biasing a fermion source nanolayer relative to an intermediate fermion transport nanolayer such that the fermion source nanolayer operates as a resonant quantum tunneling fermion source and provides fermions to the intermediate fermion transport layer; biasing a fermion sink nanolayer relative to the intermediate fermion transport nanolayer such that the fermion sink nanolayer operates as a resonant quantum tunneling fermion sink and sinks fermions from the intermediate fermion transport layer; and controlling the relative bias between the fermion source nanolayer and the fermion sink nanolayer to attain negative absolute resistance for an electric current via the intermediate fermion transport layer.

According to various, but not necessarily all, embodiments of the invention there is provided an apparatus comprising, in a single component: a first resonant quantum tunneling fermion source configured to source fermions from a first node to a fermion transport layer; a second resonant quantum tunneling fermion sink configured to sink fermions to a second node from the fermion transport layer; a first contact for applying a first voltage to the first node; a second contact for applying a second voltage to the second node; and a transport contact for enabling an electric current via the fermion transport layer.

The apparatus may, in some but not necessarily all examples, comprise circuitry configured to control the first voltage at the first contact and second circuitry configured to control the second voltage at the second contact.

In some but not necessarily all examples, the fermion transport layer is an intermediate quantum well separated from the resonant quantum tunneling fermion source by a first tunnel barrier and separated from the resonant quantum tunneling fermion sink by a second tunnel barrier.

In some but not necessarily all examples, the resonant quantum tunneling fermion source comprises a first two dimensional quantum well and the resonant quantum tunneling fermion sink comprises a second two dimensional quantum well.

In some but not necessarily all examples, the resonant quantum tunneling fermion source, the fermion transport layer and the resonant quantum tunneling fermion sink are two dimensional semiconductor structures.

In some but not necessarily all examples, the two dimensional semiconductor structures are separated by two dimensional tunnel barriers.

In some but not necessarily all examples, the two dimensional semiconductor structures and the two dimensional tunnel barriers are Van-der-Waals materials.

In some but not necessarily all examples, the two dimensional semiconductor structures and/or the two dimensional tunnel barriers are nanolayers having a thickness of less than 10 nm.

In some but not necessarily all examples, the two dimensional semiconductor structures comprise one or more graphene layers.

In some but not necessarily all examples, the two dimensional tunnel barriers comprise hexagonal boron nitride.

In some but not necessarily all examples, the current path between the quantum tunneling fermion source and the fermion transport layer has a negative differential resistance and the current path between the quantum tunneling fermion sink and the fermion transport layer has a negative differential resistance, when the fermion source nanolayer and the fermion sink nanolayer are operated with opposite voltage bias at the first and second contacts.

The apparatus may, in some but not necessarily all examples, comprise means for doping the resonant quantum tunneling fermion source relative to the fermion transport layer and for doping the resonant quantum tunneling fermion sink relative to the fermion transport layer.

According to various, but not necessarily all, embodiments of the invention there is provided an apparatus comprising: a first graphene nanolayer; a first insulating nanolayer; an intermediate graphene nanolayer; a second insulating nanolayer; and a second graphene nanolayer, and comprising a first contact for applying a first voltage to the first graphene nanolayer; a second contact for applying a second voltage to the second graphene nanolayer; and a transport contact for enabling an electric current via the intermediate graphene nanolayer.

According to various, but not necessarily all, embodiments of the invention there is provided an apparatus comprising: a first two dimensional semiconductor structure forming a first quantum well; a first tunnel barrier; an intermediate two dimensional semiconductor structure forming an intermediate quantum well; a second tunnel barrier; and a second two dimensional semiconductor structure forming a second quantum well, wherein the apparatus comprises: a first contact for applying a first voltage to the first two dimensional semiconductor structure; a second contact for applying a second voltage to the second two dimensional semiconductor structure; and a transport contact for enabling an electric current via the intermediate two dimensional semiconductor structure.

According to various, but not necessarily all, embodiments of the invention there is provided a method comprising: biasing a first quantum well relative to an intermediate quantum well such that the first quantum well operates as a resonant quantum tunneling fermion source and provides fermions to the intermediate quantum well; biasing a second quantum well relative to the intermediate quantum well such that the second quantum well operates as a resonant quantum tunneling fermion sink and sinks fermions from the intermediate quantum well; and controlling the relative bias between the first quantum well and the second quantum well to attain negative absolute resistance for an electric current via the intermediate quantum well.

BRIEF DESCRIPTION

For a better understanding of various examples that are useful for understanding the brief description, reference will now be made by way of example only to the accompanying drawings in which.

DETAILED DESCRIPTION

Figures 1, 2, 3, 4, 5, 6:
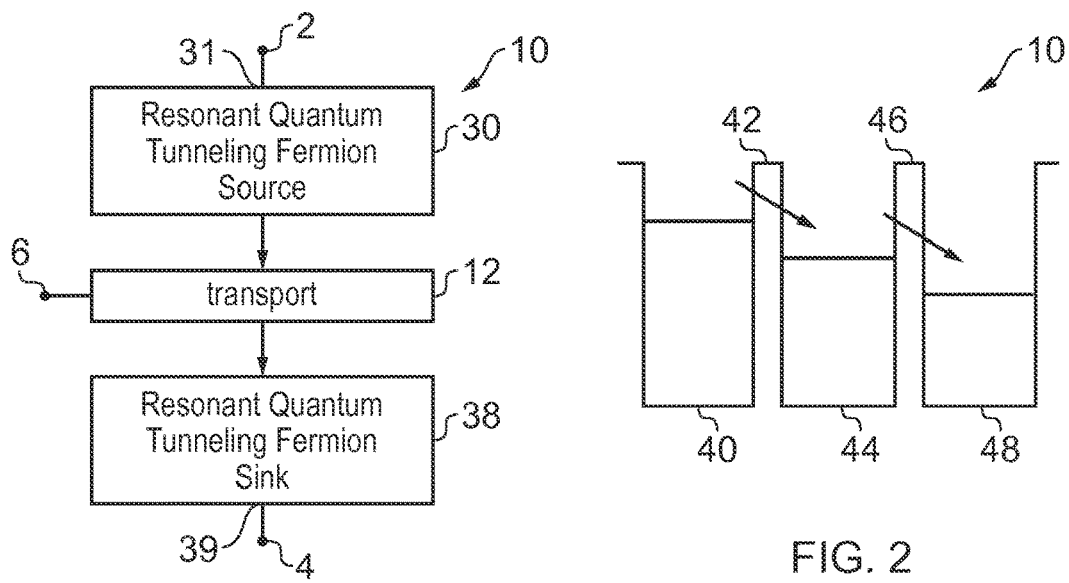
FIG. 1 illustrates an example of an apparatus comprising, as a single component: a first resonant quantum tunneling fermion source, a second resonant quantum tunneling fermion sink and a fermion transport layer.
FIG. 2 illustrates an example of the apparatus comprising, in a single component, a stack of quantum wells.
FIG. 3 illustrates absolute negative resistance.
FIG. 4 illustrates negative differential resistance.
FIG. 5 illustrates an example of the apparatus comprising voltage control circuitry.
FIG. 6 illustrates an example application of the apparatus when it is operated as a negative absolute resistor.

FIG. 1 illustrates an example of an apparatus 10 comprising, as a single component: a first resonant quantum tunneling fermion source 30 configured to source fermions from a first node 31 to a fermion transport layer 12; a second resonant quantum tunneling fermion sink 38 configured to sink fermions to a second node 39 from the fermion transport layer 12; a first contact 2 for applying a first voltage V1 to the first node 31; a second contact 4 for applying a second voltage V2 to the second node; and a transport contact 6 for enabling an electric current via the fermion transport layer 12.

Resonant quantum tunneling occurs for fermions at discrete energy levels in the first resonant quantum tunneling fermion source 30. The fermion tunneling probability can therefore both increase and decrease with a change of an applied voltage at the first contact 2. This can result in a negative differential resistance 50, for example as illustrated in FIG. 4.

Resonant quantum tunneling occurs for fermions to discrete energy levels in the second resonant quantum tunneling fermion sink 38. The fermion tunneling probability can therefore both increase and decrease with a change of an applied voltage at the second contact 4. This can result in a negative differential resistance 52, for example as illustrated in FIG. 4.

In operation, the resonant quantum tunneling fermion source 30 and the resonant quantum tunneling fermion sink 38 are operated with opposite voltage bias at the first contact 2 and the second contact 4 to form, in combination with the fermion transport layer 12, a negative absolute resistor as illustrated in FIG. 3.

A negative absolute resistor 54, has a zero electric current (I=0) when an applied potential difference is zero (V=0) and the rate of change of the electric current with potential difference, when the electric current is zero, is negative.

FIG. 5 illustrates an example of the apparatus 10 that comprises first circuitry 51 configured to control the first voltage V1 at the first contact 2 and second circuitry 53 configured to control the second voltage V2 at the second contact 4. The first voltage V1 and the second voltage V2 typically have opposite polarity.

The first circuitry 51 is configured to voltage bias the resonant quantum tunneling fermion source 30 relative to the fermion transport layer 12 to control the probability of fermions tunneling to the fermion transport layer 12 from the resonant quantum tunneling fermion source 30.

The second circuitry 53 is configured to voltage bias the resonant quantum tunneling fermion sink 38 relative to the fermion transport layer 12 to control the probability of fermions tunneling from the fermion transport layer 12 to the resonant quantum tunneling fermion sink 38.

The first circuitry 51 and the second circuitry 53 are controlled to control the relative bias between the resonant quantum tunneling fermion source 30 and resonant quantum tunneling fermion sink 38 to attain negative absolute resistance for an electric current via the fermion transport layer 12 and the transport contact 6.

The apparatus 10 in FIG. 5 is a three terminal device. One terminal is provided by the first circuitry 51, one by the second circuitry 53 and one by the transport contact 6.

FIG. 6 illustrates an example application of the apparatus 10 when it is operated as a negative absolute resistor 54. The absolute resistor is a two terminal device. It may be formed by placing the first voltage circuitry 51 between a common contact and the first contact 2 and placing the second voltage circuitry 53 between the same common contact and the second contact 4. The common contact then forms one terminal of the active absolute resistor and the transport contact 6 forms the other terminal of the active absolute resistor.

In this example a simple voltage divider circuit is provided by connecting a first resistor 60 having resistance R1 between a first voltage node 62 and an output node 64 and connecting a second negative resistor 54 having a negative resistance −R2 between the output node 64 and a second voltage node 66. In this example, the transport contact 6 is connected to the output node 64 and the common contact is connected to the second voltage node 66 (ground).

If a voltage V is applied between the first and second voltage nodes 62, 66, the voltage at the output node 64 with respect to node 66 is given by:

R2*V/(R2−R1)

R1 is positive so (R2−R1)<R2 by definition. If R2>R1, the voltage divider operates as an amplifier amplifying the voltage V; if R2<R1 the circuit will be unstable within the region of negative resistance, and will quickly resolve to a stable point in one of the saturation regions—this gives the circuit the property of bistability.

It may, in some circumstances be desirable to control the electric current-voltage characteristic of the negative resistor 54, as illustrated for example in FIG. 3. This may be achieved by controlling the fermion doping of the resonant quantum tunneling fermion source 30 relative to the fermion transport layer 12 and/or the fermion doping of the resonant quantum tunneling fermion sink 38 relative to the fermion transport layer 12. This may, for example, be controlled during manufacture by chemical doping of acceptor/donor atoms. Alternatively, it may be achieved dynamically by applying an electrostatic field to the quantum tunneling fermion source 30 to an extent more than the fermion transport layer 12 via a capacitor plate adjacent to but insulated from the quantum tunneling fermion source 30 but not adjacent the fermion transport layer 12 and/or by applying an electrostatic field (of opposite sense) to the quantum tunneling fermion sink 38 to an extent more than the fermion transport layer 12 via a capacitor plate adjacent to but insulated from the quantum tunneling fermion sink 38 but not adjacent the fermion transport layer 12.

FIG. 2 illustrates an example of the apparatus 10 illustrated in FIG. 1. In this example, but not necessarily all examples, the fermion transport layer 12 is a resonant quantum tunneling fermion sink for fermions that tunnel from the resonant quantum tunneling fermion source 30 and is a resonant quantum tunneling fermion source for fermions that tunnel to the resonant quantum tunneling fermion sink 38.

A first two dimensional quantum well 40 provides the resonant quantum tunneling fermion source 30. A second two dimensional quantum well 48 provides the resonant quantum tunneling fermion sink 38. An intermediate two dimensional quantum well 44, between the first two dimensional quantum well 40 and the second two dimensional quantum well 48, provides the fermion transport layer 12.

The first two dimensional quantum well 40 and the intermediate two dimensional quantum well 44 are separated by a first tunnel barrier 42. The second two dimensional quantum well 48 and the intermediate two dimensional quantum well 44 are separated by a second tunnel barrier 46.

The circuitry of FIG. 5 and/or FIG. 6 may also be used in combination with the apparatus 10 illustrated in FIG. 2.

FIGS. 7, 8, 9 and 10 illustrate various examples of the apparatus 10.

Figure 7:
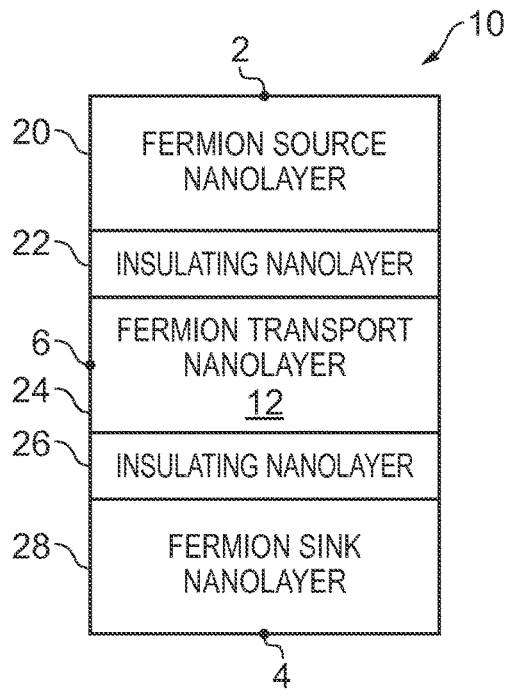
FIG. 7 illustrates an example of an apparatus comprising, in a single component, nanolayers.

In FIG. 7, the apparatus 10 comprises, in a single component: a fermion source nanolayer 20; a first insulating nanolayer 22; a fermion transport nanolayer 24; a second insulating nanolayer 26; a fermion sink nanolayer 28; a first contact 2 for applying a first voltage V1 to the fermion source nanolayer 20; a second contact 4 for applying a second voltage V2 to the fermion sink nanolayer 28; and a transport contact 6 for enabling an electric current via the fermion transport nanolayer 24.

The resonant quantum tunneling fermion source 30 is provided by the fermion source nanolayer 20 separated from the fermion transport layer 12 by the first insulating nanolayer 22 forming a first tunnel barrier 42. The fermion source nanolayer 20 provides the first quantum well 40.

The resonant quantum tunneling fermion sink 38 is provided by the fermion sink nanolayer 28 separated from the fermion transport layer 12 by a second insulating nanolayer 26 forming a second tunnel barrier 46. The fermion sink nanolayer 28 provides the second quantum well 48.

The fermion transport layer 12 is provided by a fermion transport nanolayer 24 separated from the fermion source nanolayer 20 by the first insulating nanolayer 22 and separated from the fermion sink nanolayer 28 by the second insulating nanolayer 26. The fermion transport nanolayer 24 provides the intermediate quantum well 44.

The nanolayers may, for example, have thicknesses less than 10 nm.

The fermion source nanolayer 20, the fermion transport nanolayer 24, and the fermion sink nanolayer 28 may in some but not necessarily all examples be two-dimensional semiconductor/semimetal structures.

A two-dimensional semiconductor structure may, in some examples be a natural two-dimensional semiconductor. Examples of natural two-dimensional semiconductors include graphene and functionalised graphene derivatives, two-dimensional metal dichalcogenides ($MX_2$) e.g. molybdenum disulfide ($MoS_2$), tungsten diselenide ($WSe_2$) etc.; silicene, phosphorene etc.

'Natural' is used to mean any material which naturally cleaves into single- or few-atom thick two-dimensional layers, due to comparatively weak bonding in a third dimension; such materials may be naturally occurring or man-made.

A two-dimensional semiconductor structure may, in some examples be a manufactured two-dimensional semiconductor. Examples of manufactured two-dimensional semiconductors include compound III-V semiconductors e.g. GaAs, AlGaAs etc which may be formed by molecular beam epitaxy for example.

The fermion source nanolayer 20, the fermion transport nanolayer 24, and the fermion sink nanolayer 28 may in some but not necessarily all examples be Van-der-Waals materials.

The fermion source nanolayer 20, the fermion transport nanolayer 24, and the fermion sink nanolayer 28 may in some but not necessarily all examples be graphene layers.

The first insulating nanolayer 22 and the second insulating nanolayer 26 may in some but not necessarily all examples be Van-der-Waals materials.

The first insulating nanolayer 22 and the second insulating nanolayer 26 may in some but not necessarily all examples be layers of hexagonal boron nitride, mica, vermiculite or two-dimensional metal dichalcogenides ($MX_2$) e.g. molybdenum disulfide ($MoS_2$) where the Fermi energy is aligned mid-gap.

The fermion source nanolayer 20, the first insulating nanolayer 22, the fermion transport nanolayer 24, the second insulating nanolayer 26 and the fermion sink nanolayer 28 may in some but not necessarily all examples be Van-der-Waals materials that in combination form a Van-der-Waals heterostructure.

The circuitry of FIG. 5 and/or FIG. 6 may also be used in combination with the apparatus 10 illustrated in FIG. 7.

Figure 8:
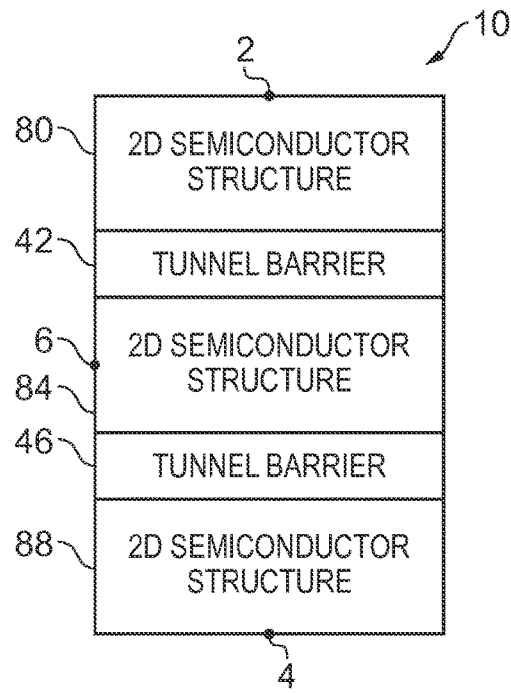
FIG. 8 illustrates an example of an apparatus comprising, in a single component, tunnel barrier separated semiconductor structures.

In FIG. 8, the apparatus 10 comprises, in a single component: a first two-dimensional semiconductor structure 80; a first tunnel barrier 42; an intermediate two-dimensional semiconductor structure 84; a second tunnel barrier 46; a second two-dimensional semiconductor structure 88; a first contact 2 for applying a first voltage V1 to the first two-dimensional semiconductor structure 80; a second contact 4 for applying a second voltage V2 to the second two-dimensional semiconductor structure 88; and a transport contact 6 for enabling an electric current via a fermion transport layer 12 in the intermediate two-dimensional semiconductor structure 84.

The resonant quantum tunneling fermion source 30 is provided by the first two-dimensional semiconductor structure 80 separated from the fermion transport layer 12 by the first tunnel barrier 42. The first two-dimensional semiconductor structure 80 provides the first quantum well 40.

The resonant quantum tunneling fermion sink 38 is provided by the second two-dimensional semiconductor structure 88 separated from the fermion transport layer 12 by the second tunnel barrier 46. The second two-dimensional semiconductor structure 88 provides the second quantum well 48.

The fermion transport layer 12 is provided by the intermediate two-dimensional semiconductor structure 84. The intermediate two-dimensional semiconductor structure 84 provides the intermediate quantum well 44.

A two-dimensional semiconductor structure may, in some examples be a natural two-dimensional semiconductor. Examples of natural two-dimensional semiconductors include graphene and functionalised graphene derivatives, two-dimensional metal dichalcogenides ($MX_2$) e.g. molybdenum disulfide ($MoS_2$), tungsten diselenide ($WSe_2$) etc., silicene, phosphorene etc.

'Natural' is used to mean any material which naturally cleaves into single- or few-atom thick two-dimensional layers, due to comparatively weak bonding in a third dimension; such materials may be naturally occurring or man-made.

A two-dimensional semiconductor structure may, in some examples be a manufactured two-dimensional semiconductor. Examples of manufactured two-dimensional semiconductors include compound III-V semiconductors e.g. GaAs, AlGaAs etc which may be formed by molecular beam epitaxy for example.

The first two-dimensional semiconductor structure 80, the intermediate two-dimensional semiconductor structure 84, and the second two-dimensional semiconductor structure 88 may, in some but not necessarily all examples, be Van-der-Waals materials.

The first two-dimensional semiconductor structure 80, the intermediate two-dimensional semiconductor structure 84, and the second two-dimensional semiconductor structure 88 may in some but not necessarily all examples be nanolayers. The nanolayers may, for example, have thicknesses less than 10 nm.

The first two-dimensional semiconductor structure 80, the intermediate two-dimensional semiconductor structure 84, and the second two-dimensional semiconductor structure 88 may in some but not necessarily all examples be graphene layers.

The first tunnel barrier 42 and the second tunnel barrier 46 may in some but not necessarily all examples be insulating nanolayers. The nanolayers may, for example, have thicknesses less than 10 nm.

The first tunnel barrier 42 and the second tunnel barrier 46 may in some but not necessarily all examples be Van-der-Waals materials.

The first tunnel barrier 42 and the second tunnel barrier 46 may in some but not necessarily all examples be layers of hexagonal boron nitride, mica, vermiculite or two-dimensional metal dichalcogenides ($MX_2$) e.g. molybdenum disulfide ($MoS_2$) where the Fermi energy is aligned mid-gap.

The first two-dimensional semiconductor structure 80, the first tunnel barrier 42, the intermediate two-dimensional semiconductor structure 84, the second tunnel barrier 46, the second two-dimensional semiconductor structure 88 may in some but not necessarily all examples be Van-der-Waals materials that in combination form a Van-der-Waals heterostructure.

The circuitry of FIG. 5 and/or FIG. 6 may also be used in combination with the apparatus 10 illustrated in FIG. 8.

Figure 9:
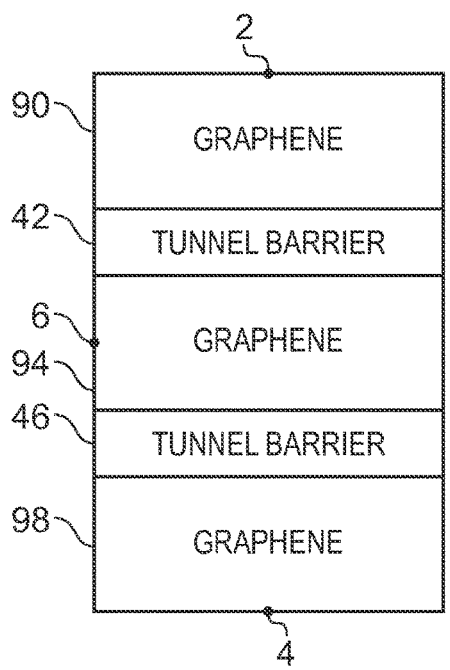
FIG. 9 illustrates an example of an apparatus comprising, in a single component, tunnel barrier separated graphene layers.

In FIG. 9, the apparatus 10 comprises, in a single component: first graphene layer(s) 90; a first tunnel barrier 42; intermediate graphene layer(s) 94; a second tunnel barrier 46; second graphene layers 98; a first contact 2 for applying a first voltage V1 to the first graphene layer(s) 90; a second contact 4 for applying a second voltage V2 to the second graphene layer(s) 98; and a transport contact 6 for enabling an electric current via a fermion transport layer 12 defined in the intermediate graphene layer(s) 94.

The graphene layer may be a monolayer, or several layers.

The resonant quantum tunneling fermion source 30 is provided by the first graphene layer(s) 90 separated from the fermion transport layer 12 by the first tunnel barrier 42. The first graphene layer(s) 90 provides the first quantum well 40.

The resonant quantum tunneling fermion sink 38 is provided by the second graphene layer(s) 98 separated from the fermion transport layer 12 by the second tunnel barrier 46. The second graphene layer(s) 98 provides the second quantum well 48.

The fermion transport layer 12 is provided by the intermediate graphene layer(s) 94. The intermediate graphene layer(s) provides the intermediate quantum well 44.

The first graphene layer(s) 90, the intermediate graphene layer(s) 94, and the second graphene layer(s) 98 may in some but not necessarily all examples each have a thickness less than 10 nm.

The first tunnel barrier 42 and the second tunnel barrier 46 may in some but not necessarily all examples be insulating nanolayers. The nanolayers may, for example, have thicknesses less than 10 nm.

The first tunnel barrier 42 and the second tunnel barrier 46 may in some but not necessarily all examples be Van-der-Waals materials.

The first tunnel barrier 42 and the second tunnel barrier 46 may in some but not necessarily all examples be layers of hexagonal boron nitride, mica, vermiculite or two-dimensional metal dichalcogenides ($MX_2$) e.g. molybdenum disulfide ($MoS_2$) where the Fermi energy is aligned mid-gap.

The circuitry of FIG. 5 and/or FIG. 6 may also be used in combination with the apparatus 10 illustrated in FIG. 9.

Figure 10:
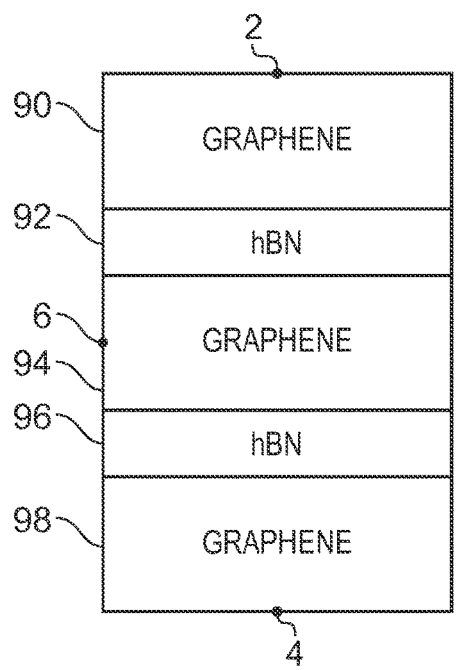
FIG. 10 illustrates an example of an apparatus comprising, in a single component, hBN separated graphene layers.

In FIG. 10, the apparatus 10 comprises, in a single component: a first layer of graphene 90; a first layer of hexagonal boron nitride 92; an intermediate layer of graphene 94; a second layer of hexagonal boron nitride 96; a second layer of graphene 98; a first contact 2 for applying a first voltage V1 to the first graphene layer(s) 90; a second contact 4 for applying a second voltage V2 to the second graphene layer(s) 98; and a transport contact 6 for enabling an electric current via the intermediate graphene layer(s) 94.

The circuitry of FIG. 5 and/or FIG. 6 may also be used in combination with the apparatus 10 illustrated in FIG. 10.

The various examples of the apparatus 10 may be manufactured in different ways. One applicable approach is to build the apparatus 10 layer by layer using for example molecular beam epitaxy (for example for compound III-V semiconductors), chemical vapour deposition (for example for insulating layers), and dry transfer procedures (for example for Van der Waals materials such as graphene and hexagonal boron nitride). These techniques are well documented in the available scientific literature and are not described in detail here.

As an example, the apparatus 10 illustrated in FIG. 7 may be manufactured using the following steps:

i) form a fermion sink nanolayer 28
ii) form an insulating nanolayer 26 on the fermion sink nanolayer 28
iii) form a fermion transport nanolayer 12 on the insulating nanolayer 26
iv) form an insulating nanolayer 22 on the fermion transport nanolayer 12
v) form a fermion source nanolayer 20 on the insulating layer 22.
vi) encapsulate and form contacts 2, 4, 6.

The order may be reversed, in which case the apparatus 10 illustrated in FIG. 7 may be manufactured using the following steps:

i) form a fermion source nanolayer 20
ii) form an insulating nanolayer 22 on the fermion source nanolayer 20
iii) form a fermion transport nanolayer 12 on the insulating nanolayer 22
iv) form an insulating nanolayer 26 on the fermion transport nanolayer 12
v) form a fermion sink nanolayer 28 on the insulating layer 26.
vi) encapsulate and form contacts 2, 4, 6.

This method of layered manufacture may also be used for the apparatus 10 illustrated in FIG. 8 where '2D semiconductor structures' replace 'fermion nanolayers' and 'tunnel barriers' replace 'insulating nanolayers' where appropriate.

This method of layered manufacture may also be used for the apparatus 10 illustrated in FIG. 9 where 'graphene' replaces 'fermion nanolayers' and 'tunnel barriers' replace 'insulating nanolayers' where appropriate.

This method of layered manufacture may also be used for the apparatus 10 illustrated in FIG. 10 where 'graphene' replaces 'fermion nanolayers' and 'hexagonal boron nitride' replaces 'insulating nanolayers' where appropriate.

The graphene may, in some examples, be monolayer graphene.

The crystal orientation of the graphene crystal may be determined by visual inspection of a flake—the graphene will tend to break along axis aligned to the underlying crystal structure, so the shape of the flake can be used to determine the crystal orientation. Alternatively, the crystal orientation of graphene grown (e.g. by chemical vapour deposition) will conform to the crystal orientation of the growth substrate, so if this is known then the graphene orientation can be determined.

Where graphene is used, it may be appropriate to align the crystal orientations of the layers 90, 94, 98 to facilitate quantum tunneling. This is achieved by determining the crystalline orientation of the graphene layers as described above, and then controlling the alignment between the layers during the dry transfer process.

Where graphene is used, it may be appropriate to control misalignment of the crystal orientations of the layers 90, 94, 98 to control the current-voltage characteristic of the apparatus 10. This control of misalignment is achieved by determining the crystalline orientation of the graphene layers as described above, and then controlling the alignment between the layers during the dry transfer process.

As an example, the apparatus 10 illustrated in FIG. 10 may be manufactured using the following steps:

A standard cleavage technique is used to prepare relatively thick hexagonal boron nitride (hBN) crystals on top of an oxidised Si wafer.

Monolayer graphene is transferred onto the hBN crystal using a dry transfer procedure. This is followed with an anneal at 350° C.

Monolayer hBN is transferred onto the graphene using a dry transfer procedure. The hBN is positioned for crystal registration (alignment) with the graphene. This is followed with an anneal at 350° C.

Monolayer graphene is transferred onto the hBN using a dry transfer procedure. The graphene is positioned for crystal registration with the hBN. This is followed with an anneal at 350° C.

Monolayer hBN is transferred onto the graphene using a dry transfer procedure. The hBN is positioned for crystal registration with the graphene. This is followed with an anneal at 350° C.

Monolayer graphene is transferred onto the hBN using a dry transfer procedure. The graphene is positioned for crystal registration with the hBN. This is followed with an anneal at 350° C.

The resulting structure may be encapsulated with hBN and contacts are then formed.

Although the Figs illustrate different layers having different thicknesses, the thicknesses are not to scale. The fermion nanolayers 20, 24, 28; 2D semiconductor structures 80, 84, 88; graphene layers 90, 94, 98 may, for example, be thinner than the respective insulating layers 22, 26; tunnel barriers 42, 46; hexagonal boron nitride 92, 96.

As used in this application, the term 'circuitry' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

Where a structural feature has been described, it may be replaced by means for performing one or more of the functions of the structural feature whether that function or those functions are explicitly or implicitly described.

As used here 'module' refers to a unit or apparatus that excludes certain parts/components that would be added by an end manufacturer or a user. The apparatus 10 may be a module.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
a fermion source nanolayer;
a first insulating nanolayer;
a fermion transport nanolayer;
a second insulating nanolayer;
a fermion sink nanolayer;
a first contact for applying a first voltage to the fermion source nanolayer;
a second contact for applying a second voltage to the fermion sink nanolayer; and
a transport contact for enabling an electric current via the fermion transport nanolayer;
wherein said fermion sink nanolayer is comprised of the same material as said fermion transport nanolayer, wherein the apparatus is configured to be operated with the fermion source nanolayer and the fermion sink nanolayer biased with opposite voltage bias, wherein a current path between the fermion source nanolayer and the fermion transport nanolayer has a negative differential resistance and a current path between the fermion sink nanolayer and the fermion transport nanolayer has a negative differential resistance, enabling a negative absolute resistor.

2. An apparatus as claimed in claim 1, further comprising circuitry configured to control the first voltage at the first contact and second circuitry configured to control the second voltage at the second contact.

3. An apparatus as claimed in claim 1, wherein the fermion source nanolayer forms a resonant quantum tunneling fermion source and the fermion sink nanolayer forms a resonant quantum tunneling fermion sink.

4. An apparatus as claimed in claim 1, wherein the fermion source nanolayer and the first insulating nanolayer form a first two dimensional quantum well, the fermion sink nanolayer and the second insulating nanolayer form a second two dimensional quantum well and the fermion transport nanolayer forms an intermediate quantum well between the first insulating layer and the second insulating layer.

5. An apparatus as claimed in claim 1, wherein the fermion source nanolayer, the fermion transport nanolayer and the fermion sink nanolayer are two dimensional semiconductor structures.

6. An apparatus as claimed in claim 1, wherein the fermion source nanolayer the fermion transport nanolayer and the fermion sink nanolayer are two dimensional Vander-Waals materials.

7. An apparatus as claimed in claim 1, wherein the first insulating nanolayer and the second insulating nanolayer are two dimensional Van-der-Waals materials.

8. An apparatus as claimed in claim 5 wherein the fermion source nanolayer; the first insulating nanolayer; the fermion transport nanolayer; the second insulating nanolayer; the fermion sink nanolayer each have a thickness of less than 10 nm.

9. An apparatus as claimed in claim 1, wherein fermion source nanolayer, the fermion transport nanolayer and the fermion sink nanolayer are graphene layers.

10. An apparatus as claimed claim 6, wherein the first insulating nanolayer; and the second insulating nanolayer comprise hexagonal boron nitride.

11. An apparatus as claimed in claim 1 further comprising a capacitor plate adjacent the fermion source nanolayer configured to apply an electrostatic field to the fermion source nanolayer to dope the fermion source nanolayer relative to the fermion transport nanolayer and/or further comprising a capacitor plate adjacent the fermion sink nanolayer configured to apply an electrostatic field to the fermion sink nanolayer to dope the fermion sink nanolayer relative to the fermion transport nanolayer.

12. A method comprising:
   biasing a fermion source nanolayer relative to an intermediate fermion transport nanolayer such that the fermion source nanolayer operates as a resonant quantum tunneling fermion source and provides fermions to the intermediate fermion transport layer;
   biasing a fermion sink nanolayer relative to the intermediate fermion transport nanolayer such that the fermion sink nanolayer operates as a resonant quantum tunneling fermion sink and sinks fermions from the intermediate fermion transport layer, wherein said fermion sink nanolayer is comprised of the same material as said fermion transport nanolayer; and
   controlling the relative bias between the fermion source nanolayer and the fermion sink nanolayer to attain negative absolute resistance for an electric current via the intermediate fermion transport layer.

13. An apparatus comprising, in a single component:
   a first resonant quantum tunneling fermion source configured to source fermions from a first node to a fermion transport layer;
   a second resonant quantum tunneling fermion sink configured to sink fermions to a second node from the fermion transport layer;
   a first contact for applying a first voltage to the first node;
   a second contact for applying a second voltage to the second node; and
   a transport contact for enabling an electric current via the fermion transport layer;
   wherein said resonant quantum tunneling fermion sink is comprised of the same material as said fermion transport layer,
   wherein the apparatus is configured to be operated with the first contact and the second contact biased with opposite voltage bias, wherein a current path between the quantum tunneling fermion source and the fermion transport layer has a negative differential resistance and a current path between the quantum tunneling fermion sink and the fermion transport layer has a negative differential resistance, enabling a negative absolute resistor.

14. An apparatus as claimed in claim 13, further comprising circuitry configured to control the first voltage at the first contact and second circuitry configured to control the second voltage at the second contact.

15. An apparatus as claimed in claim 13, wherein the fermion transport layer is an intermediate quantum well separated from the resonant quantum tunneling fermion source by a first tunnel barrier and separated from the resonant quantum tunneling fermion sink by a second tunnel barrier.

16. An apparatus as claimed in claim 13, wherein the resonant quantum tunneling fermion source comprises a first two dimensional quantum well and the resonant quantum tunneling fermion sink comprises a second two dimensional quantum well.

17. An apparatus as claimed in claim 13, wherein the resonant quantum tunneling fermion source, the fermion transport layer and the resonant quantum tunneling fermion sink are two dimensional semiconductor structures.

18. An apparatus as claimed in claim 17, wherein the two dimensional semiconductor structures are separated by two dimensional tunnel barriers.

19. An apparatus as claimed in claim 18, wherein the two dimensional semiconductor structures and the two dimensional tunnel barriers are Van-der-Waals materials.

20. An apparatus as claimed in claim 18, wherein the two dimensional semiconductor structures comprise at least one of:
   one or more graphene layers; and
   hexagonal boron nitride.

21. An apparatus as claimed in claim 1, wherein the fermion source nanolayer and the first insulating nanolayer form a two dimensional quantum well.

22. An apparatus as claimed in claim 1, wherein the fermion sink nanolayer and the second insulating nanolayer form a two dimensional quantum well.

* * * * *